US011769692B2

(12) United States Patent
Liou et al.

(10) Patent No.: US 11,769,692 B2
(45) Date of Patent: Sep. 26, 2023

(54) HIGH BREAKDOWN VOLTAGE INTER-METAL DIELECTRIC LAYER

(71) Applicant: Taiwan Semiconductor Manufacturing Co., Ltd., Hsinchu (TW)

(72) Inventors: Joung-Wei Liou, Zhudong Town (TW); Chin Kun Lan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/432,569

(22) Filed: Jun. 5, 2019

(65) Prior Publication Data

US 2020/0135552 A1 Apr. 30, 2020

Related U.S. Application Data

(60) Provisional application No. 62/753,310, filed on Oct. 31, 2018.

(51) Int. Cl.
 *H01L 21/768* (2006.01)
 *H01L 21/02* (2006.01)
 *H01L 23/532* (2006.01)

(52) U.S. Cl.
 CPC .... *H01L 21/76832* (2013.01); *H01L 21/0228* (2013.01); *H01L 21/02178* (2013.01);
 (Continued)

(58) Field of Classification Search
 CPC ......... H01L 21/76823; H01L 21/02178; H01L 21/0228; H01L 21/02205; H01L 21/76834;
 (Continued)

(56) References Cited

U.S. PATENT DOCUMENTS 6,319,765 B1 * 11/2001 Cho ..................... C23C 16/18
 257/E21.011
6,342,277 B1 * 1/2002 Sherman ........... C23C 16/45542
 117/103
(Continued)

FOREIGN PATENT DOCUMENTS

CN 101609810 A 12/2009
CN 106356332 A 1/2017
(Continued)

OTHER PUBLICATIONS

Office Action directed to related Chinese Patent Application No. 201911055447.8, dated Dec. 21, 2021, with attached English-language translation; 7 pages.
(Continued)

*Primary Examiner* — Michael Jung
(74) *Attorney, Agent, or Firm* — Sterne, Kessler, Goldstein & Fox P.L.L.C.

(57) ABSTRACT

The present disclosure relates to a method of forming a semiconductor structure. The method includes depositing an etch-stop layer (ESL) over a first dielectric layer. The ESL layer deposition can include: flowing a first precursor over the first dielectric layer; purging at least a portion of the first precursor; flowing a second precursor over the first dielectric layer to form a sublayer of the ESL layer; and purging at least a portion of the second precursor. The method can further include depositing a second dielectric layer on the ESL layer and forming a via in the second dielectric layer and through the ESL layer.

20 Claims, 6 Drawing Sheets

(52) U.S. Cl.
CPC .. *H01L 21/02205* (2013.01); *H01L 21/02274* (2013.01); *H01L 21/76877* (2013.01); *H01L 23/5329* (2013.01)

(58) Field of Classification Search
CPC ......... H01L 21/76802; H01L 21/76826; H01L 21/02274; H01L 23/5329; H01L 23/53295; H01L 21/66813; H01L 21/76832; H01L 21/02315; H01L 21/76829; H01L 21/76813; H01L 21/76807; H01L 21/76877
See application file for complete search history.

(56) References Cited

U.S. PATENT DOCUMENTS

| | | | | |
|---|---|---|---|---|
| 6,551,399 | B1* | 4/2003 | Sneh | H01L 28/40 257/E21.171 |
| 9,859,153 | B1* | 1/2018 | Rainville | C23C 22/05 |
| 10,566,185 | B2* | 2/2020 | Wang | H01L 21/76897 |
| 10,665,501 | B2 | 5/2020 | Rainville et al. | |
| 2001/0006835 | A1 | 7/2001 | Kim et al. | |
| 2003/0168001 | A1* | 9/2003 | Sneh | C23C 16/02 117/86 |
| 2004/0137743 | A1* | 7/2004 | Chung | H01L 21/31116 438/700 |
| 2004/0171280 | A1* | 9/2004 | Conley, Jr. | H01L 29/66583 438/785 |
| 2004/0203254 | A1* | 10/2004 | Conley, Jr. | H01L 21/0228 438/778 |
| 2004/0214430 | A1* | 10/2004 | Ruelke | H01L 21/02167 438/687 |
| 2009/0236745 | A1 | 9/2009 | Vrtis et al. | |
| 2009/0321941 | A1* | 12/2009 | Metz | H01L 21/31641 257/758 |
| 2012/0177903 | A1* | 7/2012 | Sneck | C23C 28/42 428/216 |
| 2012/0181694 | A1* | 7/2012 | Usami | H01L 23/5226 257/751 |
| 2012/0202103 | A1* | 8/2012 | Yu | H01M 2/1646 429/144 |
| 2015/0167165 | A1* | 6/2015 | Lindfors | C23C 16/54 427/255.23 |
| 2015/0380302 | A1 | 12/2015 | Mountsier et al. | |
| 2016/0017487 | A1* | 1/2016 | Chen | C23C 16/34 427/569 |
| 2016/0148800 | A1* | 5/2016 | Henri | C23C 16/045 438/485 |
| 2016/0365271 | A1 | 12/2016 | Chang et al. | |
| 2016/0372543 | A1* | 12/2016 | Xie | H01L 21/28255 |
| 2017/0018458 | A1 | 1/2017 | Cheng et al. | |
| 2017/0103914 | A1* | 4/2017 | Damjanovic | H01L 23/53295 |
| 2017/0294348 | A1* | 10/2017 | Mebarki | H01L 21/76897 |
| 2018/0096886 | A1* | 4/2018 | Reddy | H01L 21/02274 |
| 2018/0233350 | A1* | 8/2018 | Tois | H01L 21/76834 |
| 2018/0274097 | A1* | 9/2018 | Lei | C23C 16/345 |
| 2019/0057859 | A1* | 2/2019 | Chan | H01L 21/0337 |
| 2019/0371660 | A1* | 12/2019 | Kuo | H01L 21/76831 |
| 2023/0008675 | A1 | 1/2023 | Lion et al. | |

FOREIGN PATENT DOCUMENTS

| | | |
|---|---|---|
| CN | 108133880 A | 6/2018 |
| KR | 20010063478 A | 7/2001 |
| KR | 20030058846 A | 7/2003 |

OTHER PUBLICATIONS

Cimalla et al., "Densification of Thin Aluminum Oxide Films by Thermal Treatments," Materials Sciences and Applications, vol. 5, Jun. 2014; pp. 628-638.

Lechaux et al., "Impact of oxygen plasma postoxidation process on $Al_2O_3/n$-$In_{0.53}Ga_{0.47}As$ metal-oxide-semiconductor capacitors," Applied Physics Letters, vol. 109, Sep. 27, 2016; pp. 1-4.

Office Action directed to related Chinese patent application CN201911055447.8, dated Jun. 15, 2022; 7 pages.

* cited by examiner

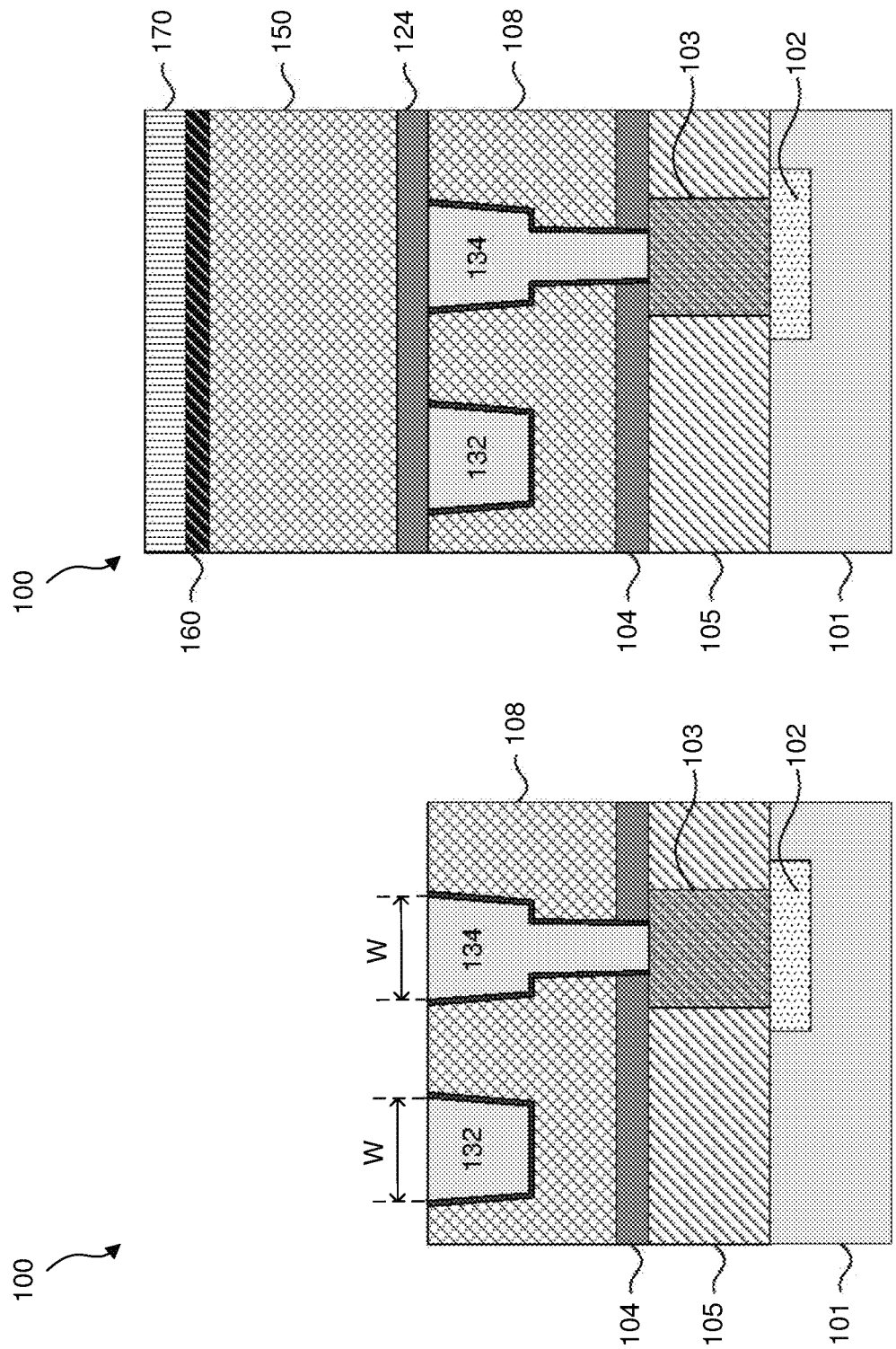

US 11,769,692 B2

HIGH BREAKDOWN VOLTAGE INTER-METAL DIELECTRIC LAYER

This application claims the benefit of U.S. Provisional Patent Application No. 62/753,310, titled "High Breakdown Voltage Inter-metal Dielectric Layer," which was filed on Oct. 31, 2018 and is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 1A-1F are cross-sectional views of a partially-formed semiconductor interconnect structure, in accordance with some embodiments.

DETAILED DESCRIPTION

Figure 1B:
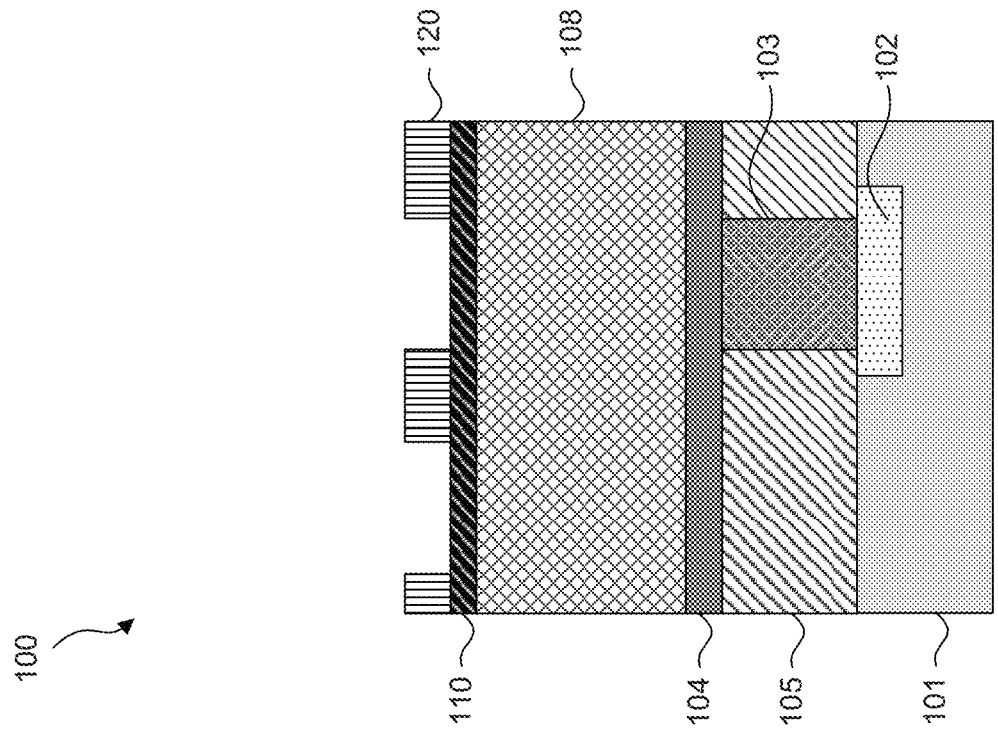

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

Semiconductor interconnect fabrication processes between front end of line (FEOL) and back end of line (BEOL) stages of the integrated circuit fabrication process include a metallization process that produces openings in a pre-metal dielectric (PMD) layer (e.g., silicon oxide ($SiO_2$)) and a process to fill these openings with metal (e.g., cobalt (Co), tungsten (W), or copper (Cu)). Metal layers within BEOL processes are separated by dielectric layers, for example, inter-metal dielectric layers (IMD). PMD or IMD layers can be formed using physical vapor deposition (PVD) deposition processes. The metallization processes can be accomplished using a damascene process, which became widely used in integrated circuit manufacturing. The damascene process can involve creating interconnect schemes by cutting trenches into a dielectric and then filling those trenches with metal. Excess metal can be polished away. However, metal oxidation can occur during subsequent PMD or IMD layer deposition due to bombardment of particles during deposition, such as during a PVD process.

As technologies progress, integrated circuits are characterized by decreasing dimension requirements over previous generation devices. However, there are challenges to implement such features and processes; for example, decreased critical dimensions of a photolithography process can result in reduced thicknesses of the PMD layer and/or IMD layer. However, reduced dielectric layer thickness can lead to various challenges. For example, a PMD or IMD layer formed by PVD processes with lower film thickness can lead to (i) lower break down voltages that reduces device reliability; (ii) pin holes within the deposited PMD and IMD layers that can cause electrical shorts between two conductive layers; or (iii) larger RC delay as the capacitance between two metal layers is inversely proportional to the dielectric layer thicknesses.

Atomic layer deposition (ALD) processes are developed from a variety of CVD processes to provide conformal thin film deposition. ALD processes feature sequential alternating exposure of chemical precursors that react with the substrate. In an ALD process, a first precursor is pulsed into a reaction chamber under vacuum for a predetermined amount of time to allow the first precursor to react (e.g. fully react) with the substrate surface. Subsequently, the reaction chamber is purged with an inert gas to remove any unreacted precursor and reaction by-products. A second precursor is then pulsed into the reaction chamber to react with the reacted first precursor and form one or more atomic layers (collectively called "a sublayer") of the desired material. This process is then cycled until a nominal film thickness is achieved.

Various embodiments in accordance with this disclosure provide structures and methods of forming dielectric layers such as an IMD layer. In some embodiments, the IMD layer can have high etching selectivity over an overlying layer and the IMD layer can also be referred to as an "etch stop layer" (ESL), serving as a stop for the etching of the overlying layer. In some embodiments, the methods provided in the present disclosure can be used to form an ESL, an inter-layer dielectric layer (ILD), and other suitable layers. In some embodiments, an IMD layer, ESL, or ILD layer can be formed using an ALD process. In some embodiments, the IMD layer or ESL can be an aluminum oxide layer. In some embodiments, the IMD layers and ESL and methods for forming IMD layers and ESL can be applied to the structure and formation of PMD layers, but are not described here in detail for simplicity.

The present disclosure presents embodiments for forming etch-stop layers (ESLs). The formation of ESLs is provided as an example, and it should be noted that the methods described herein may be employed for other dielectric layers in multiple technology nodes and in a variety of device types. In some embodiments, the ESL layers and methods for forming the same can be incorporated in a 32 or 28 nm pitch structure. In some embodiments, the ESL layers and methods for forming the same can be incorporated in technology nodes of 7 nm or less. For example, embodiments described herein may also be applied in 5 nm or 3 nm technology nodes. In some embodiments, ESL layers can be suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices. In addition, embodiments disclosed herein may be employed in the formation of p-type and/or n-type devices. Other semiconductor structures may also benefit from embodiments of the present disclosure, such as contacts and interconnects. Damascene processes can involve creating interconnect structures by cutting trenches and/or vias into a dielectric layer and then filling those trenches and/or vias with conductive material. An example of a damascene process is a dual damascene process, which creates trenches and vias in the dielectric layer and deposits conductive material in both features. The dual damascene process can include multiple patterning and etch steps, such as a first patterning/etch step that forms vias in the dielectric layer so as to provide electrical connection with the underlying metal layer, and a second patterning/etch step to form trenches for the conductive lines. The two patterning/etch steps can be performed in different orders, such as in a (i) trench first then via order; or (ii) a via first then trench order. The dual damascene process can also be a self-aligned dual damascene process using etch stop layers.

In accordance with various embodiments of this disclosure, ESL layers formed using ALD or CVD in semiconductor structures provides, among other things, benefits of (i) high breakdown voltage (e.g., greater than about 8.5 MV/m); (ii) high film quality by having fewer pin holes; (iii) reduced RC constant due to reduced film dielectric constant (e.g., between about 7 and about 8.5); and (iv) reduced oxidation to underlying metal due to less oxygen bombardment in the ALD or CVD processes compared to a PVD processes.

Figure 2:
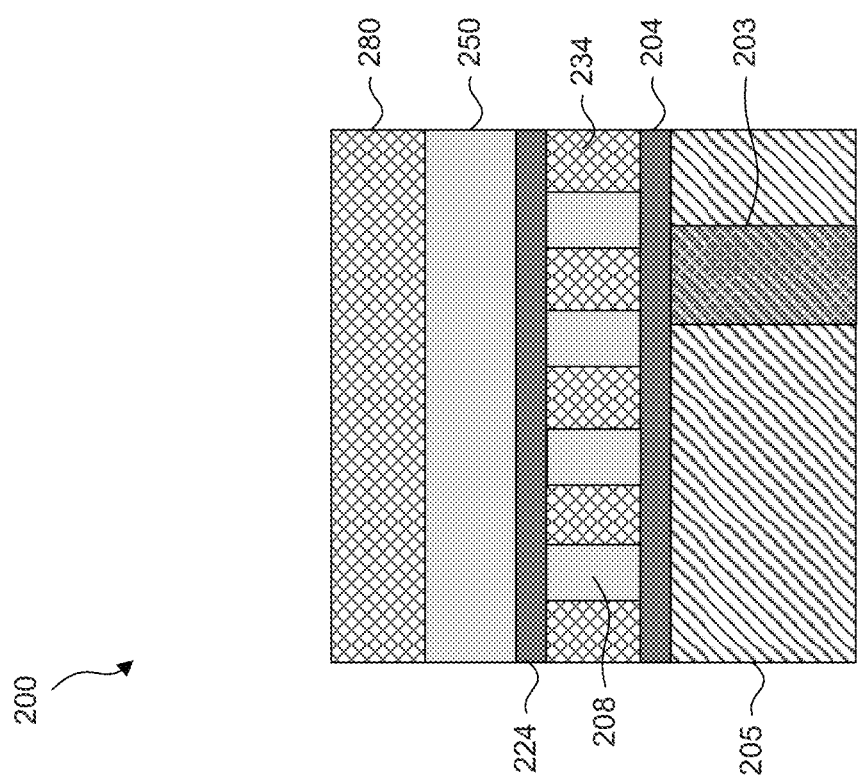
FIGS. 2-3 are cross-sectional views of various partially-formed semiconductor interconnect structures having etch-stop layers (ESLs), in accordance with some embodiments
Figure 3:
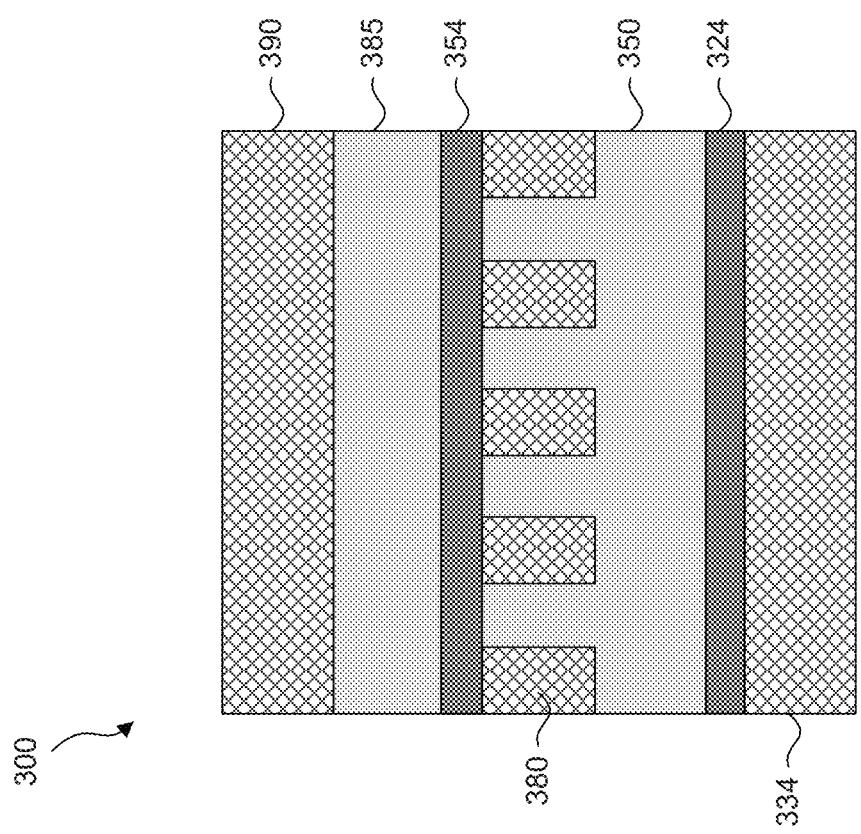

FIGS. 1A-1F provide various views of a semiconductor device fabrication process that illustrate the formation of ESL layers using ALD or CVD processes in semiconductor interconnect structures, in accordance with some embodiments. FIGS. 2-3 are cross-sectional views of semiconductor devices having ESL layers deposited using ALD or CVD processes. The fabrication processes provided herein are exemplary, and alternative processes in accordance with this disclosure can be performed (though they are not shown in these figures). More than one pair of via and trench can be formed in the semiconductor interconnect structure.

Figure 1A:
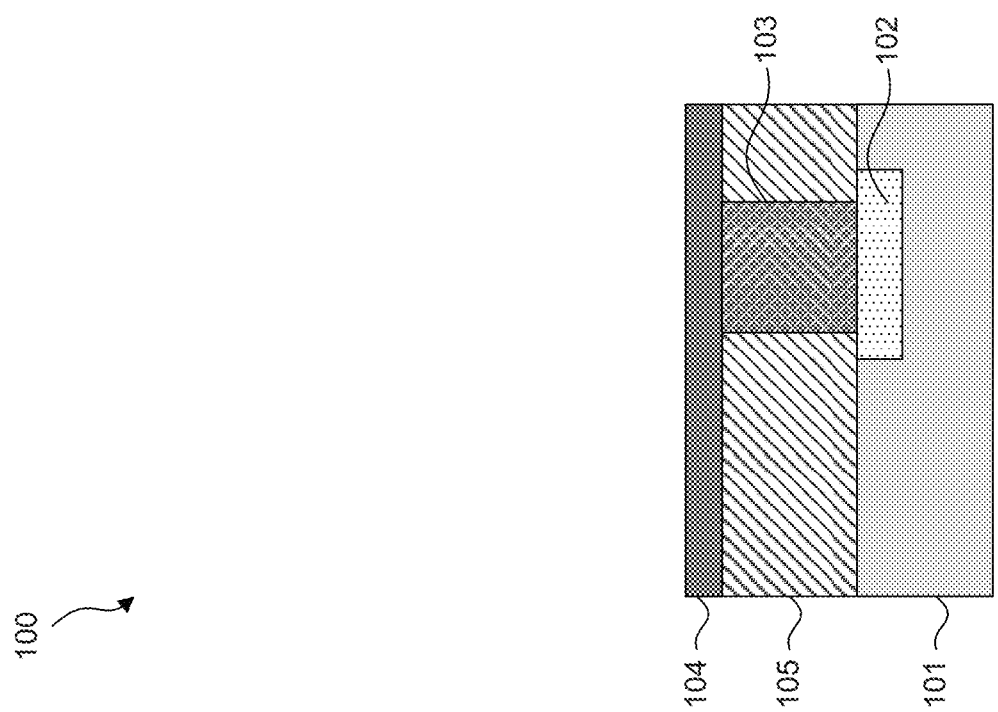

FIG. 1A is a cross-sectional view of a partially-fabricated semiconductor interconnect structure after the formation of an ESL layer on a dielectric layer, in accordance with some embodiments of the present disclosure. Partially-fabricated semiconductor interconnect structure 100 can include a substrate 101, a device terminal 102, a conductive interconnection layer 103, a first etch stop layer 104, and a dielectric structure 105. In some embodiments, semiconductor interconnect structure 100 can include substrates, other etch stop layers, other dielectric layers, and/or other suitable materials.

Substrate 101 can be a p-type substrate such as, for example, a silicon material doped with a p-type dopant such as boron. In some embodiments, substrate 101 can be an n-type substrate such as, for example, a silicon material doped with an n-type dopant such as phosphorous or arsenic. In some embodiments, substrate 101 can include, germanium, diamond, a compound semiconductor, an alloy semiconductor, a silicon-on-insulator (SOI) structure, any other suitable material, and/or combinations thereof.

Device terminal 102 can be terminals or terminal contacts for semiconductor devices embedded in substrate 101. For example, an integrated circuit including components such as power devices, storage devices, logic devices, and any other suitable devices can be embedded in substrate 101. In some embodiments, the semiconductor devices can include a plurality of transistors configured to be complementary metal-oxide-semiconductor (CMOS) devices. In some embodiments, the integrated circuit can include logic, analog, radio-frequency (RF) parts made out of a variety of transistors, field-effect transistors (FETs), capacitors, resistors, and interconnections. Device terminal 102 can be terminals or terminal contacts of the semiconductor devices. For example, device terminal 102 can be a source region, a drain region, or a gate region of a transistor, according to some embodiments.

In some embodiments, dielectric structure 105 can be made of a low-k dielectric material. In some embodiments, dielectric structure 105 can be formed of any suitable dielectric material, such as silicon oxide ($SiO_x$), organosilicate ($SiO_xC_yH_z$), silicon oxycarbide ($SiO_xC_y$), silicon carbide ($SiC_x$), silicon nitride ($SiN_x$), and/or other suitable dielectric material. The deposition of dielectric structure 105 can be performed by any suitable processes, such as chemical vapor deposition (CVD), physical vapor deposition (PVD), atomic layer deposition (ALD), molecular beam epitaxy (MBE), high density plasma CVD (HDPCVD), metal organic CVD (MOCVD), remote plasma CVD (RPCVD), plasma-enhanced CVD (PECVD), plating, other suitable methods, or combinations thereof.

Conductive interconnection layer 103 can be an active region of a semiconductor device and embedded in a dielectric structure 105. In some embodiments, conductive interconnection layer 103 can be a metal layer providing electrical connections to integrated circuits and devices. The composition of conductive interconnection layer 103 can include suitable materials, such as silver (Ag), aluminum (Al), gold (Au), copper (Cu), ruthenium (Ru), cobalt (Co), nickel (Ni), W, manganese (Mn), molybdenum (Mo), cobalt tungsten (CoW), cobalt tungsten phosphorous (CoWP), other suitable materials, or combinations thereof. In some embodiments, conductive interconnection layer 103 can be a contact structure electrically and physically contacting device terminal 102. For example, conductive interconnection layer 103 can be a source/drain contact formed using cobalt.

In some embodiments, first etch stop layer 104 can be an ESL layer formed on dielectric structure 105 and interconnection layer 103. First etch stop layer 104 can be used to prevent the etching of dielectric structure 105 and conductive interconnection layer 103 during subsequent processing. According to embodiments of the present disclosure, composition of first etch stop layer 104 can be aluminum oxide deposited using ALD or CVD. Other exemplary compositions can include aluminum nitride, silicon oxynitride (Si-$O_xN_y$), silicon oxide, other suitable materials, or combinations thereof. The deposition of first etch stop layer 104 can be performed using ALD or CVD, as further described below.

First etch stop layer 104 can be an ESL layer containing aluminum oxide and deposited using ALD. The ALD process can be a thermal ALD process where a reaction chamber is maintained at a temperature between about 250 degrees Celsius and about 350 degrees Celsius. In some embodiments, a processing temperature of about 325 degrees Celsius can provide a nominal surface uniformity of the deposited ESL layer. In some embodiments, a pre-deposition plasma treatment can be performed on the substrate prior to the ALD deposition of ESL layer. For example, a plasma treatment process can be performed at a pressure between about 0.5 Torr and about 10 Torr using $NH_3$, $N_2$, He, $H_2$, Ar, or any suitable gases. For example, an ALD process used to produce an ESL layer containing aluminum oxide can include flowing a pre-treatment gas such as ammonia ($NH_3$) into a reaction chamber under vacuum for a predetermined amount of time to allow the $NH_3$ to react (e.g., fully react) with the surfaces of dielectric structure 105 and interconnection layer 103 to form dangling hydrogen bonds. In some embodiments, the plasma treatment process can be performed at a temperature between about 150 degrees Celsius and about 400 degrees Celsius. The pressure of the reaction chamber can be maintained between about 0.5 Torr and about 10 Torr. The plasma treatments described herein can also be applied to subsequently deposited ESL layers.

A first precursor of trimethylaluminum (TMA) can be pulsed into a reaction chamber under vacuum for a predetermined amount of time to allow the TMA to react (e.g., fully react) with the hydrogen bonds formed by $NH_3$ on the substrate and interconnect surface. A methyl group of TMA (e.g., —$CH_3$) can react with the dangling hydrogen bonds and form Al—N bonds. The chemical reaction releases $CH_4$ into the reaction chamber. After the first precursor TMA is reacted (e.g., fully reacted) with the device surface, a methyl group (e.g., —$CH_3$) can be dangling from the substrate surface. The first precursor flowing can be performed for any suitable time period. For example, the first precursor flowing process can be performed for any suitable time period between about 0.2 s and about 5 s. In some embodiments, the flowing process can be performed for about 0.2 s, 0.5 s, 1 s, 2 s, 3 s, 4, or 5 s, depending on the device area or device surface topography. For example, a substrate with planar surface where reactants of the first precursor TMA can easily approach the substrate surface, a shorter soaking time may be needed. In some embodiments, where substrate surface includes various trenches/vias or other protruding structures, longer soaking time may be needed. The flow rate of first precursor can be between about 10 sccm and about 3000 sccm. In some embodiments, the flow rate of first precursor can be between about 10 sccm and about 300 sccm.

A first purging process using an inert gas, such as nitrogen, argon, or $N_2O$, is performed in the reaction chamber to remove any portions of TMA (e.g., unreacted TMA) and reaction by-products. The first purging process can be performed for duration between about 1 s and about 10 s or until unreacted and reaction by-products are removed.

A second precursor is then pulsed into the reaction chamber to allow surface reaction with the first precursor and form one or more atomic layers of aluminum oxide. In some embodiments, second precursor can be tert-butanol (($CH_3)_3COH$). The second precursor can react with the —$CH_3$ dangling bonds formed by the first precursor. For example, the dangling bond of —$CH_3$ can replace the OH bond of tert-butanol and produce by-product of $C(CH_3)_4$. After second precursor has reacted (e.g., fully reacted) with the substrate surface, a sublayer of aluminum oxide can be formed. In some embodiments, the second precursor can be $H_2O$, ethylene glycol, tert-amyl alcohol (TAA), any other suitable precursors, or combinations thereof. Similar to the first precursor soaking process, the second precursor soaking process can be performed for any suitable time period such that second precursor can be reacted (e.g., fully reacted) with the substrate surface. For example, the second precursor flowing process can be performed for any suitable time period between about 1 s and about 10 s. In some embodiments, the flowing process can be performed for about 1 s, 2 s, 5 s, or 10 s, depending on the device area or device surface topography. The flow rate of second precursor can be between about 10 sccm and about 3000 sccm. In some embodiments, the flow rate of second precursor can be between about 10 sccm and about 300 sccm.

A second purging process is performed in the reaction chamber to remove any portions of the second precursor (e.g., unreacted second precursor) and any reaction by-products. Any suitable gas can be used for the second purging gas, such as $N_2$, Argon, $N_2O$, or combinations thereof. For simplicity purposes, a single deposition cycle can be defined as including the above-described two flowing and two purging processes. This deposition cycle is then repeated until a nominal film thickness of ESL layer is achieved. In some embodiments, a thickness of the ESL layer can be between about 5 angstroms and about 50 angstroms.

In some embodiments, a post-deposition plasma treatment can be used to treat the deposited sublayer prior to the deposition of the next sublayer. The post-deposition plasma treatment can improve the film quality of deposited ESL layer and result in fewer pin holes and fewer leak paths for water molecules which in turn reduces the possibility of electrical shorts formed through the ESL layer. In some embodiments, a plasma treatment can be performed at a pressure between about 0.5 Torr and about 10 Torr using $O_2$, $NH_3$, $N_2$, He, $H_2$, Ar, or any suitable gas. For example, an ALD process used to produce an ESL layer containing aluminum oxide can include flowing a post-treatment gas, such as $O_2$, into a reaction chamber under vacuum for a predetermined amount of time. The post-treatment plasma process can be a thermal process where the reaction chamber is maintained at a temperature between about 150 degrees Celsius and about 400 degrees Celsius. In some embodiments, the radio frequency (RF) power of the plasma treatment can be between about 20 W and about 300 W. The pressure of the reaction chamber can be maintained between about 0.5 Torr and about 10 Torr. After the post-deposition plasma treatment, the first precursor can be injected into the reaction chamber again to continue deposition of ESL layer until a nominal layer thickness is achieved.

ESL layers produced using the aforementioned ALD processes can provide various benefits. For example, the composition of the aluminum oxide layer can provide the benefit of increased breakdown voltage (e.g., greater than about 8.5 unit: MV/m). The ESL layers demonstrate higher density which can correspond to better etch stop ability. The atomic composition of the formed aluminum oxide layer can include an aluminum content between about 30% and about 45%, an oxygen content between about 55% and about 70%, and a hydrogen content between about 0.5% and about 3%. In some embodiments, the oxygen to aluminum atomic ratio can be between about 1.2 and about 2.3. Further, the ALD-deposited ESL layer can also have a dielectric constant (e.g., between about 7 and about 8.5) lower than PVD-deposited ESL layers (e.g., between 8.5 and 9.5), which in turn produces a lower capacitance and a lower RC constant (assuming the same ESL film thicknesses produced by ALD and PVD depositions). Further, compared to PVD deposition methods, which includes bombardment of underlying substrate using reactant ions (e.g., oxygen ions), the ALD process introduces less ion bombardment so oxygen ions are less likely to penetrate into the underlying metal layer, causing undesirable metal oxidation. For example, the oxidation of interconnect layer 103 can be reduced if the aforementioned ALD process is used, compared to a PVD process, and less metal oxide would be formed at the top of interconnect layer 103. For example, interconnect layer 103 can be formed of cobalt and the aforementioned ALD process can reduce cobalt oxide formation in interconnect layer 103.

FIG. 1B is a cross-sectional view of a partially-fabricated semiconductor interconnect structure after the formation of dielectric layers and masking layers for forming trenches and via, in accordance with some embodiments of the present disclosure. First dielectric layer 108 is formed on first etch stop layer 104. In some embodiments, first dielectric layer 108 can be made of a dielectric material, such as silicon oxide, spin-on-glass, silicon nitride, silicon oxynitride, silicon oxycarbide, silicon carbide, fluorine-doped silicate glass (FSG), organosilicate, low-k dielectric material, and/or other suitable insulating material. The dielectric value of first dielectric layer 108 can be in a range between about 1 and about 3.9. The deposition of first dielectric layer 108 can be performed by any suitable processes, such as CVD, PVD, ALD, MBE, HDPCVD, MOCVD, RPCVD, PECVD, other suitable methods, or combinations thereof. A first masking layer 110 can be formed on top surface of first dielectric layer 108. First masking layer 110 can be used to provide protection for portions of first dielectric layer 108 during formation of trenches and via in first dielectric layer 108. In some embodiments, first masking layer 110 can be formed of a photoresist, a hard mask, and/or other suitable materials. Other exemplary compositions include silicon nitride, silicon oxide, and/or other suitable materials.

A second masking layer 120 can be formed on a top surface of first masking layer 110. In some embodiments, second masking layer 120 can be a patterned masking layer, exposing portions of first masking layer 110. In some embodiments, second masking layer 120 can be formed using the same material of first masking layer 110. In some embodiments, second masking layer 120 can be formed using different materials. The patterning process to form patterns in second masking layer 120 can include depositing a masking layer, forming a photoresist layer over the masking layer, exposing the photoresist layer to a pattern, performing post-exposure bake processes, and developing the resist to form a masking element consisting of the photoresist. The masking element can then be used to protect regions of second masking layer 120, while one or more etching processes removes the masking material of second masking layer 120 to expose portions of first masking layer 110.

Figures 1C, 1D:

FIG. 1C is a cross-sectional view of a partially-fabricated semiconductor interconnect structure after the formation of vias and trenches in dielectric layers using the first and second masking layers as masks, in accordance with some embodiments of the present disclosure. In some embodiments, vias and trenches can be formed in first dielectric layer 108 using one or more etching processes. For example, a first etching process can remove the exposed first masking layer 110 and a second etching process can be used to remove portions of first dielectric layer such that openings can be formed in first dielectric layer 108. In some embodiments, trench 111 can be formed in first dielectric layer 108 without exposing underlying first etch stop layer 104. The etching process to form trench 111 can be determined by the composition of first dielectric layer 108 and include any suitable dry etching process, such as a reactive ion etch (RIE) and/or other suitable process. In some embodiments, trench 111 can be formed using a wet chemical etching process. Numerous other methods to form trench 111 in first dielectric layer 108 may be suitable and one or more etching processes may be needed. The etching process can continue until a nominal trench depth is achieved.

In some embodiments, via 113 can be formed in first dielectric layer to expose the underlying interconnect layer 103. One or more etching processes can be used to form via 113. In some embodiments, via 113 can be formed using multiple etching processes where a wider opening is formed in a top portion of via 113 and a narrower opening is formed in a lower portion of via 113. In some embodiments, top portion of via 113 can be a trench extending in the same direction as trench 111. In some embodiments, one or more etching processes can be used to remove exposed portions of first masking layer 110 and subsequently exposed portions of first dielectric layer 108 to expose portions of first etch stop layer 104. Further etching processes can be used to remove exposed portions of first etch stop layer 104 to expose underlying interconnect layer 103.

FIG. 1D is a cross-sectional view of a partially-fabricated semiconductor interconnect structure after filling the trenches and vias with conductive material, in accordance with some embodiments of the present disclosure. A barrier layer can be formed in the trenches and vias prior to the deposition of conductive material. For example, a barrier layer can be used to prevent the diffusion of conductive material into first dielectric layer 108. In some embodiments, the barrier layer can be formed of titanium nitride, titanium oxide, any suitable barrier layer material, or combinations thereof. In some embodiments, the barrier layer can be deposited using CVD, PVD, ALD, MBE, HDPCVD, MOCVD, RPCVD, PECVD, other suitable methods, or combinations thereof. Trench 111 and via 113 are filled with a conductive layer 130 that is in contact with conductive interconnection layer 103. Conductive layer 130 formed in via 113 can be conductive lines that are electrically coupled to conductive interconnection layer 103. In some embodiments, the composition of conductive layer 130 includes suitable metals, such as Ag, Al, Au, Cu, Ru, Co, Ni, W, Mn, Mo, CoW, CoWP, other suitable materials, or combinations thereof. Conductive layer 130 can be deposited by any suitable filling process, such as CVD, PVD, ALD, MBE, HDPCVD, MOCVD, RPCVD, PECVD, plating, other suitable methods, or combinations thereof. In some embodiments, the filling process can be a bottom up plating process where the conductive layer growth starts at a bottom of via 113 and progresses upwards until via 113 is filled. In some embodiments, conductive layer 130 can be formed using suitable electrochemical plating processes. In some embodiments, the plating process can be an electroless plating process having a chemical bath using formaldehyde or glyoxylic acid as a reduction agent. The bath can also include a copper organic compound solvent. A seed layer 122 having a same or different material as conductive layer 130 can be formed on exposed surfaces within trench 111 and via 113 prior to the formation of the conductive layer 130. The seed layer 122 can be formed by any suitable processes, such as CVD, PVD, ALD, MBE, HDPCVD, MOCVD, RPCVD, PECVD, other suitable methods, or combinations thereof. In some embodiments, there can be an overfill of the material that form conductive layer 130 above a top surface of second masking layer 120.

FIG. 1E is a cross-sectional view of a partially-fabricated semiconductor interconnect structure after performing a planarization process, in accordance with some embodiments of the present disclosure. After the deposition of conductive material 130, the top surfaces of semiconductor interconnect structure 100 can be planarized using any suitable process. Excessive material of conductive layer 130 and first and second masking layers 110 and 120 can be removed using any suitable process, such as dry etching, wet etching, reactive ion etching, and/or other etching method. Any other suitable method may alternatively be utilized, such as a chemical mechanical polishing (CMP) process that can also planarize the surfaces of first dielectric layer 108 and remaining conductive layer 130 such that these surfaces are substantially level. After the planarization process, conductive structures 132 and 134 can be formed respectively in trench 111 and via 113. In some embodiments, widths W of conductive structures 132 and 134 measured at a top surface of first dielectric layer 108 can be in a range between about 16 nm and about 10 μm. For example, width W can be about 16 nm. In some embodiments, width W can be less than about 16 nm, depending on the device design and/or the critical dimension photolithography process used to form conductive structures 132 and 134. In some embodiments, conductive structures 132 and 134 can have different widths per device design or other considerations.

FIG. 1F is a cross-sectional view of a partially-fabricated semiconductor interconnect structure after subsequent structures are formed, in accordance with some embodiments of the present disclosure. For example, second etch stop layer 124, second dielectric layer 150, third masking layer 160, and fourth masking layer 170 can be subsequently formed on the top surfaces of conductive structures 132 and 134 and first dielectric layer 108. In some embodiments, second etch stop layer 124 can be formed using similar processes as first etch stop layer 104. For example, second etch stop layer 124 can be an ESL layer formed using ALD-deposited aluminum oxide. In some embodiments, second dielectric layer 150 can be similar to first dielectric layer 108 described above. In some embodiments, third and fourth masking layer 160 and 170 can be similar to first and second masking layer 110 and 120, respectively.

FIG. 2 is a cross-sectional view of a partially-fabricated semiconductor structure, in accordance with some embodiments of the present disclosure. Partially-fabricated semiconductor structure 200 includes conductive interconnection layer 203 formed within first dielectric layer 205. In some embodiments, first dielectric layer 205 can be formed of silicon oxide and similar to first dielectric layer 108 described above. In some embodiments, first dielectric layer 205 can be an inter-layer dielectric (ILD) layer. Conductive interconnection layer 203 can be formed of copper, cobalt, tungsten, any suitable conductive material, or combinations thereof. Conductive interconnection layer 203 can be similar to conductive interconnection layer 103 described above.

A first etch stop layer 204 is formed on top surfaces of conductive interconnection layer 203 and first dielectric layer 205. First etch stop layer 204 can be formed of aluminum oxide and formed using an ALD or CVD process. In some embodiments, the formation and structure of first etch stop layer 204 can be similar to first etch stop layer 104 described above in FIG. 1A. In some embodiments, first etch stop layer 204 can have a thickness between about 5 angstroms and about 50 angstroms. In some embodiments, thickness of first etch stop layer 204 can be between about 10 Å and about 70 Å. In some embodiments, first etch stop layer 204 can include multiple layers, such as a combination of a first ALD aluminum oxide layer, a silicon oxycarbide layer, and a second ALD aluminum oxide layer. In some embodiments, the first and second ALD aluminum oxide layer thicknesses can be between about 15 angstroms and 30 angstroms, respectively. A second dielectric layer 208 can be formed on first etch stop layer 204. In some embodiments, second dielectric layer 208 can be similar to first dielectric layer 108 described above. In some embodiments, second dielectric layer can be formed of silicon oxycarbide. In some embodiments, second dielectric layer 208 can have a thickness between about 10 Å and about 100 Å.

Conductive structures 234 can be formed within second dielectric layer 208. In some embodiments, conductive structures 234 can be similar to conductive structures 134 described above. In some embodiments, conductive structures 234 can be formed on an MO metal layer of a semiconductor device. In some embodiments, pitches of conductive structures 234 can be less than about 40 nm. In some embodiments, the pitch is less than about 32 nm. In some embodiments, conductive structures 234 can be formed using a conductive material that is different from conductive interconnection layer 203. For example, conductive structures 234 can be formed using copper, and conductive interconnection layer 203 can be formed using cobalt.

Second etch stop layer 224 can be deposited on top surfaces of second dielectric layer 208 and conductive structure 234. Second etch stop layer 224 can be similar to first etch stop layer 204 and formed using ALD processes described above in FIG. 1A. In some embodiments, second etch stop layer 224 can be formed using aluminum oxide. In some embodiments, second etch stop layer 224 can have a thickness between about 5 angstroms and about 50 angstroms. In some embodiments, second etch stop layer 224 can have a thickness between about 10 Å and about 70 Å. In some embodiments, second etch stop layer 224 can include multiple layers. Processing of second etch stop layer 224 such as etching can use underlying second dielectric layer 208 as an etch stop. Third dielectric layer 250 can be formed on second etch stop layer 224 and formed using similar material as first or second dielectric layers 205 and 208, respectively.

In some embodiments, third dielectric layer 250 can be an ILD layer. Conductive structures 280 can be formed on third dielectric layer 250 and can be formed using copper, cobalt, tungsten, any suitable conductive structure, or combinations thereof. In some embodiments, conductive structures 280 can be formed in an M1 metal layer of the partially-fabricated semiconductor structure 200. The widths of conductive structures 234 and 280 can be between about 16 nm and about 24 nm. The heights of conductive structures 234 and 280 can be between about 33 nm and about 45 nm. Capacitance of the semiconductor capacitor formed using the ESL layer can be between about 0.27 and about 0.32.

First and second etch stop layers 204 and 224 described in FIG. 2 can be formed using ALD processes similar to those described in FIG. 1A for forming first etch stop layer 104. First and second etch stop layers 204 and 224 produced using the aforementioned ALD processes can provide various benefits. For example, the composition of the aluminum oxide layer can provide the benefit of increased breakdown voltage of about 10 MV/m. The composition of the formed aluminum oxide layer can include an aluminum atomic content between about 30% and about 45%, an oxygen atomic content between about 55% and about 70%, and a hydrogen atomic content between about 0.5% and about 3%. In some embodiments, the oxygen to aluminum atomic ratio can be between about 1.2 and about 2.3. Further, the ALD-deposited ESL layer can also have a lower dielectric constant (e.g., between about 7 and about 8.5) that is lower than PVD-deposited ESL layers, which in turn produces a lower capacitance and a lower RC constant. Further, compared to PVD deposition methods which includes bombardment of underlying substrate using reactant ions (e.g., oxygen ions), the ALD process introduces less ion bombardment so the oxygen ions are less likely to penetrate into the underlying metal layer, causing undesirable metal oxidation. For example, the oxidation of interconnect layer 203 can be reduced if the aforementioned ALD process is used, compared to a PVD process, and less metal oxide would be formed at the top of interconnect layer 203.

FIG. 3 is a cross-sectional view of a partially-fabricated semiconductor structure, in accordance with some embodiments of the present disclosure. Partially-fabricated semiconductor structure 300 includes first conductive structures 334 and first etch stop layer 324 formed on first conductive structures 334. In some embodiments, first conductive structures 334 can be formed within an M0 layer of partially-fabricated semiconductor structure 300. Conductive structures 334 can be formed of copper, cobalt, tungsten, any suitable conductive material, or combinations thereof. Conductive structures 334 can be similar to conductive structures 234 described above.

A first etch stop layer 324 is formed on top surfaces of conductive structures 334. First etch stop layer 324 can be formed of aluminum oxide and formed using an ALD or CVD process. In some embodiments, the formation and structure of first etch stop layer 324 can be similar to first etch stop layer 104 described above in FIG. 1A. In some embodiments, first etch stop layer 324 can have a thickness between about 5 angstroms and about 50 angstroms. In some embodiments, first etch stop layer 324 can include multiple layers, such as a combination of a first ALD aluminum oxide layer, a silicon oxycarbide layer, and a second ALD aluminum oxide layer. In some embodiments, the first and second ALD aluminum oxide layer thicknesses can be between about 15 Å and about 30 Å, respectively. In some embodiments, the first and second ALD aluminum oxide layer thickness can be different. For example, the first ALD aluminum oxide layer can have a thickness between about 15 Å and about 20 Å, and the second ALD aluminum oxide layer can have a thickness between about 20 Å and about 30 Å.

A first dielectric layer 350 can be formed of silicon oxide and similar to first dielectric layer 108 described above. In some embodiments, first dielectric layer 350 can be an ILD layer. Conductive structures 380 can be formed within first dielectric layer 350. In some embodiments, conductive structures 380 can be similar to conductive structures 280 described above in FIG. 2. In some embodiments, conductive structures 380 can be formed on an M1 metal layer of a semiconductor device. In some embodiments, conductive structures 380 can be formed using the same materials as conductive structures 334. In some embodiments, conductive structures 380 and conductive structures 334 can be formed using different materials. For example, conductive structures 380 can be formed using copper, and conductive structures 334 can be formed using cobalt. In some embodiments, pitches of conductive structures 380 can be less than about 40 nm. In some embodiments, the pitch is less than about 32 nm. The pitch of conductive structures 380 can vary based on various factors. For example, the pitch can be determined by which conductive layer conductive structures 380 are formed in. For example, conductive structures 380 formed in an M0 layer can have a pitch of about 32 nm, and conductive structures 380 formed in an M1 layer can have a pitch of about 40 nm. In some embodiments, the pitch of conductive structures 380 formed in an M0 layer can have a greater pitch than conductive structures 380 formed in an M1 layer. Second etch stop layer 354 can be deposited on top surfaces of first dielectric layer 350 and conductive structures 380. Second etch stop layer 354 can be similar to first etch stop layer 324 and formed using ALD processes described above in FIG. 1A. In some embodiments, second etch stop layer 354 can be formed using aluminum oxide. In some embodiments, second etch stop layer 354 can have a thickness between about 5 angstroms to about 50 angstroms. In some embodiments, second etch stop layer 354 can include multiple layers.

A second dielectric layer 385 can be formed on second etch stop layer 354. In some embodiments, composition of second dielectric layer 385 can be similar to second dielectric layer 108 described above. In some embodiments, second dielectric layer can be formed of silicon oxycarbide. Conductive structures 390 can be formed on second dielectric layer 385 and can be formed using copper, cobalt, tungsten, any suitable conductive structures, or combinations thereof. In some embodiments, conductive structures 390 can be formed in an M2 metal layer of the partially-fabricated semiconductor structure 300.

First and second etch stop layers 324 and 354 described in FIG. 3 can be formed using ALD processes similar to those described in FIG. 1A for forming first etch stop layer 104. First and second etch stop layers 324 and 354 produced using the aforementioned ALD processes can provide various benefits, such as the benefits provided by first and second etch stop layers 204 and 224, and are not described here in detail for simplicity.

Figure 4:
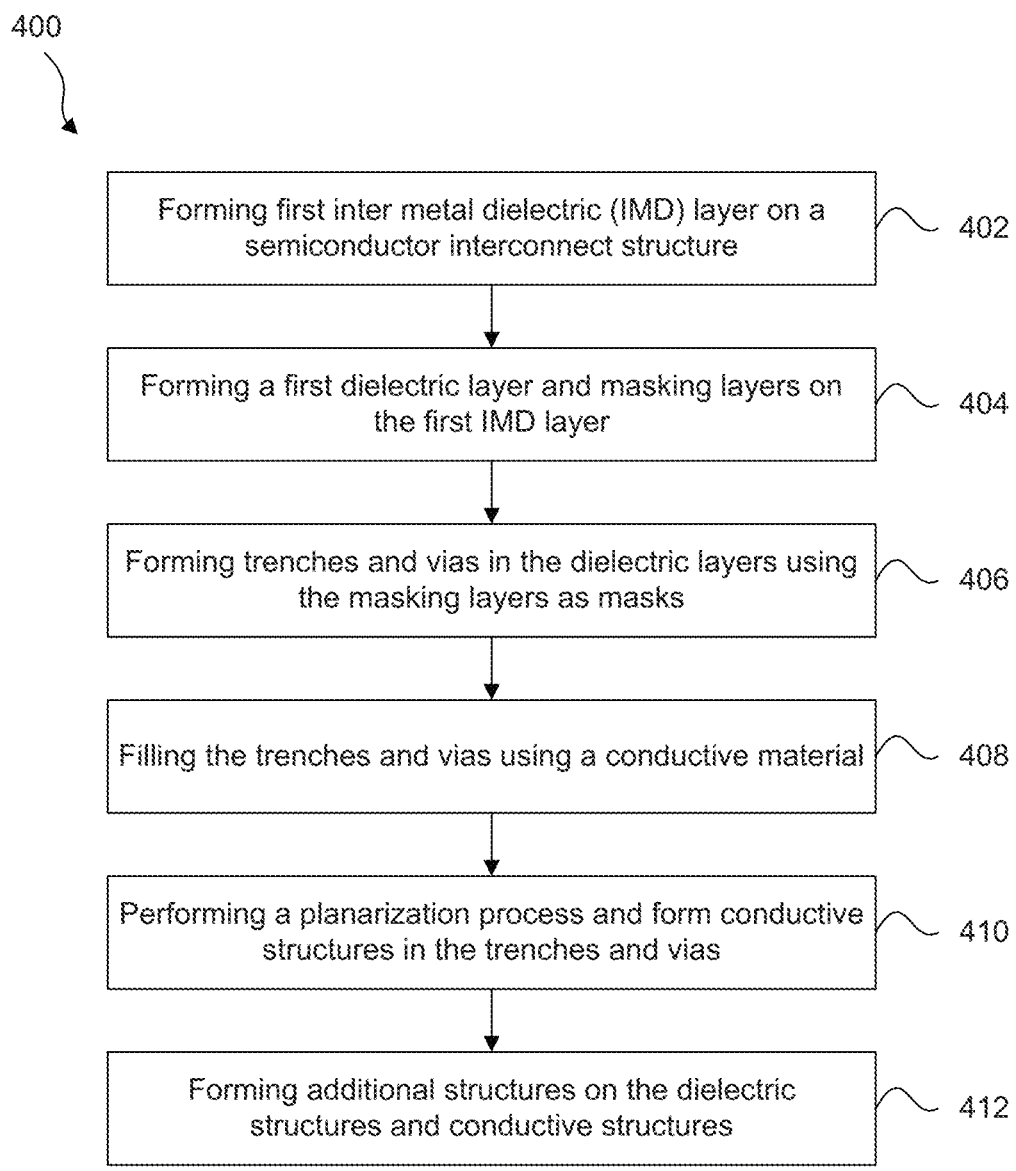
FIG. 4 is a flow diagram of an exemplary method of forming IMD layers in semiconductor interconnect structures, in accordance with some embodiments.

FIG. 4 is a flow diagram of an exemplary method 400 of forming semiconductor structures incorporating ALD ESL layers, in accordance with some embodiments of the present disclosure. Based on the disclosure herein, other operations in method 400 can be performed. Further, the operations of method 400 can be performed in a different order and/or vary.

At operation 402, a first ESL layer is formed on a semiconductor interconnect structure, in accordance with some embodiments. The semiconductor interconnect structure can include a dielectric structure, a conductive interconnection layer, other conductive layers, and one or more dielectric layers. The semiconductor structure can also include other layers as needed. Examples of the dielectric layer, conductive interconnection layer, conductive layers, and one or more dielectric layers are described above with respect to FIG. 1A. In some embodiments, the dielectric structure can be made of a low-k dielectric material. Conductive interconnection layer can be formed in the dielectric structure providing electrical connections to integrated circuits and devices. The first ESL layer can be used to prevent the etching of the dielectric structure and the conductive interconnection layer during subsequent processing. According to embodiments of the present disclosure, composition of the first ESL layer can be aluminum oxide deposited using ALD or CVD. Other exemplary compositions can include aluminum nitride, silicon oxynitride ($Si_xN_y$), silicon oxide, other suitable materials, or combinations thereof. The deposition of the first ESL layer can be performed using ALD or CVD, similar to the deposition process of etch stop layer 104 described above and not further described here in detail for simplicity.

The first ESL layer produced using the aforementioned ALD processes can provide various benefits. For example, the composition of the aluminum oxide layer can provide the benefit of increased breakdown voltage (e.g., greater than about 8.5 MV/m). The composition of the formed aluminum oxide layer can include an aluminum content between about 30% and about 45%, an oxygen content between about 55% and about 70%, and a hydrogen content between about 0.5% and about 3%. In some embodiments, the oxygen to aluminum atomic ratio can be between about 1.2 and about 2.3. Further, the ALD-deposited ESL layer can also have a lower dielectric constant (e.g., between about 7 and about 8.5) that is lower than PVD-deposited ESL layers, which in turn produces a lower capacitance and a lower RC constant. Further, compared to PVD deposition methods which includes bombardment of underlying substrate using reactant ions (e.g., oxygen ions), the ALD process introduces less ion bombardment so the oxygen ions are less likely to penetrate into the underlying metal layer, causing undesirable metal oxidation. For example, the oxidation of interconnect layer 103 can be reduced if the aforementioned ALD process is used, compared to a PVD process, and less metal oxide would be formed at the top of interconnect layer 103.

At operation 404, a first dielectric layer and masking layers are formed on the first ESL layer, in accordance with some embodiments. In some embodiments, the first dielectric layer can be made of a dielectric material, such as silicon oxide, spin-on-glass, silicon nitride, silicon oxynitride, silicon oxycarbide, silicon carbide, fluorine-doped silicate glass (FSG), organosilicate, low-k dielectric material, and/or other suitable insulating material. The dielectric value of the first dielectric layer can be in a range from about 1 to about 3.9. The deposition of the first dielectric layer can be performed by any suitable process, such as CVD, PVD, ALD, MBE, HDPCVD, MOCVD, RPCVD, PECVD, other suitable methods, or combinations thereof. One or more first masking layers can be formed on a top surface of the first dielectric layer. Masking layers can be used to provide protection for portions of the first dielectric layer during formation of trenches and via in the first dielectric layer. Examples of masking layers can be first and second masking layers 110 and 120 described above in FIG. 1B.

At operation 406, vias and trenches are formed in the dielectric layers using the masking layers as masks, in accordance with some embodiments. In some embodiments, vias and trenches can be formed in the first dielectric layer using one or more etching processes. For example, one or more etching process can be used to remove portions of the first dielectric layer such that openings can be formed in the first dielectric layer. In some embodiments, the trenches can be formed in the first dielectric layer without exposing the underlying first etch stop layer. In some embodiments, vias can also be formed in the first dielectric layer to expose the underlying interconnect layer. One or more etching processes can be used to form the vias. Examples of trenches and vias can be trenches and vias 111 and 113 respectively, described above with reference to FIG. 1C.

At operation 408, trenches and vias are filled with conductive material, in accordance with some embodiments. In some embodiments, a barrier layer can be formed in the trenches and vias prior to the deposition of conductive material. The trenches and vias are filled with a conductive layer that is in contact with the underlying conductive interconnection layer. In some embodiments, the composition of the conductive layer includes suitable metals, such as Ag, Al, Au, Cu, Ru, Co, Ni, W, Mn, Mo, CoW, CoWP, other suitable materials, or combinations thereof. In some embodiments, a filling process can be a bottom up plating process where the conductive layer growth starts at a bottom of the via and progresses upwards until the via is filled. Examples of the conductive layer can be conductive layer 130 described above in FIG. 1D.

At operation 410, a planarization process is performed and conductive structures are formed in the trenches and vias, in accordance with some embodiments of the present disclosure. After deposition of the conductive material, the top surfaces of the semiconductor interconnect structure can be planarized using suitable processes. Excessive material of the conductive layer and the masking layers can be removed using suitable processes, such as dry etching, wet etching, reactive ion etching, and/or other etching methods. Any other suitable methods may alternatively be utilized, such as a chemical mechanical polishing (CMP) process that can also planarize the surfaces of the first dielectric layer and the remaining conductive layer such that these surfaces are substantially level. After the planarization process, conductive structures can be formed respectively in the trenches and vias. Examples of conductive structures can be conductive structures 132 and 134 described above in FIG. 1E.

At operation 412, additional structures are formed on the dielectric structures and conductive structures, in accordance with some embodiments. For example, a second ESL layer and/or additional ESL layers, dielectric layers, masking layers can be formed on the top surfaces of the conductive structures and the first dielectric layer. In some embodiments, additional ESL layers can be formed using similar processes as the first ESL layer. For example, additional ESL layers can be formed using ALD-deposited aluminum oxide. In some embodiments, additional dielectric layers can be similar to the first dielectric layer described above in FIG. 1B. Examples of additional structures can be second etch stop layer 124, second dielectric layer 150, and third and fourth masking layers 160 and 170 described above in FIG. 1F.

Various embodiments in accordance with this disclosure provide structures and methods of forming ESL layer in semiconductor devices. In some embodiments, an ESL layer can be formed using ALD or CVD processes. In some embodiments, the ESL layer can be an aluminum oxide layer. In some embodiments, the ESL layers and methods for forming ESL layers can be applied to the structure and formation of PMD layers, but are not described here in detail for simplicity.

In accordance with various embodiments of this disclosure, ESL layers formed using ALD or CVD in semiconductor structures provides, among other things, benefits of (i) high breakdown voltage (e.g., greater than about 8.5 MV/m); (ii) high film quality by having fewer pin holes; (iii) reduced RC constant due to reduced film dielectric constant; and (iv) reduced oxidation to underlying metal due to less oxygen bombardment in the ALD or CVD processes compared to a PVD processes.

Embodiments of the present disclosure include a method of forming a semiconductor structure. The method includes depositing an etch-stop layer (ESL) over a first dielectric layer. The ESL layer deposition can include: flowing a first precursor over the first dielectric layer; purging at least a portion of the first precursor; flowing a second precursor over the first dielectric layer to form a sublayer of the ESL layer; and purging at least a portion of the second precursor. The method can further include depositing a second dielectric layer on the ESL layer and forming a via in the second dielectric layer and through the ESL layer.

Embodiments of the present disclosure also include a method of forming a semiconductor structure. The method includes forming a conductive structure in a first dielectric layer and depositing a second dielectric layer over the first dielectric layer. The second dielectric layer deposition can include: flowing a first precursor over the first dielectric layer; removing at least a portion of the first precursor; flowing a second precursor over the first dielectric layer; and removing at least a portion of the second precursor. The method can further include depositing a third dielectric layer on the second dielectric layer and forming a via in the third dielectric layer and through the second dielectric layer.

Embodiments of the present disclosure further includes a semiconductor interconnect structure. The semiconductor structure includes: a first conductive structure in a first dielectric layer; an aluminum oxide layer over the first dielectric layer, wherein a dielectric constant of the aluminum oxide layer is between about 7 and about 8.5; a second dielectric layer on the aluminum oxide layer; a second conductive structure in the second dielectric layer and through the aluminum oxide layer, where the first and second conductive structures are connected.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of forming a semiconductor structure, comprising:
   depositing an etch stop layer (ESL) over a first dielectric layer, wherein the depositing comprises:
   performing, on the first dielectric layer, a first plasma treatment process comprising an ammonia-based plasma process;
   performing a deposition cycle to form a first sublayer of the ESL, comprising:
   flowing a first precursor over the plasma-treated first dielectric layer, wherein the first precursor comprises aluminum;
   purging at least a portion of the first precursor;
   flowing a second precursor over the plasma-treated first dielectric layer to form the first sublayer of the ESL; and
   purging at least a portion of the second precursor;
   performing a second deposition cycle to form a second sublayer of the ESL on the first sublayer of the ESL; and
   performing a second plasma treatment process on the first sublayer of the ESL prior to performing the second deposition cycle, wherein the second plasma treatment process comprises an oxygen-based plasma process;
   depositing a second dielectric layer on the ESL; and
   forming a via in the second dielectric layer and through the ESL.

2. The method of claim 1, wherein depositing the ESL comprises depositing aluminum oxide.

3. The method of claim 1, wherein the first precursor comprises trimethylaluminum (TMA).

4. The method of claim 1, wherein the second precursor comprises one of tert-butanol $((CH_3)_3COH)$, $H_2O$, ethylene glycol, or tert-amyl alcohol (TAA).

5. The method of claim 1, wherein performing the first plasma treatment process comprises flowing ammonia ($NH_3$) over the first dielectric layer at a temperature between about 150 degrees Celsius and about 400 degrees Celsius and at a chamber pressure between about 0.5 Torr and about 10 Torr.

6. The method of claim 1, wherein a temperature of the second plasma treatment process is between about 150 degrees Celsius and about 400 degrees Celsius.

7. The method of claim 1, further comprising depositing copper in the via.

8. The method of claim 1, further comprising repeating the deposition cycle.

9. A method of forming a semiconductor structure, comprising:
   forming a conductive structure in a first dielectric layer;
   performing, on the first dielectric layer, a first plasma treatment process comprising an ammonia-based plasma process;
   depositing a second dielectric layer over the first dielectric layer, wherein the depositing comprises depositing an aluminum oxide layer with an oxygen to aluminum atomic ratio of about 1.2 to about 2.3 by:
   flowing a first precursor over the first dielectric layer;
   removing at least a portion of the first precursor;
   flowing a second precursor over the first dielectric layer;
   removing at least a portion of the second precursor; and
   performing a second plasma treatment process on the second dielectric layer;
   depositing a third dielectric layer on the second dielectric layer; and
   forming a via in the third dielectric layer and through the second dielectric layer.

10. The method of claim 9, wherein the first precursor comprises trimethylaluminum (TMA).

11. The method of claim 9, wherein the second precursor comprises one of tert-butanol ((CH$_3$)$_3$COH), H$_2$O, ethylene glycol, or tert-amyl alcohol (TAA).

12. The method of claim 9, wherein:
performing the second plasma treatment process on the second dielectric layer comprises performing an oxygen-based plasma process.

13. The method of claim 9, wherein forming the conductive structure comprises depositing cobalt.

14. The method of claim 13, further comprising depositing copper in the via.

15. The method of claim 9, further comprising:
forming a plurality of metal structures in the first dielectric layer; and
performing a third plasma treatment on the plurality of metal structures.

16. A method of forming a semiconductor interconnect structure, comprising:
depositing a first dielectric layer in a deposition chamber;
forming a plurality of metal structures in the first dielectric layer;
performing a first plasma treatment on the first dielectric layer and the plurality of metal structures in the deposition chamber;
forming an etch stop layer with an aluminum content of about 30% to about 45%, an oxygen content of about 55% to about 70%, and a hydrogen content of about 0.5% to about 3% on the first dielectric layer, comprising:
flowing a trimethylaluminum (TMA) precursor over the first dielectric layer;
purging at least a portion of the TMA precursor, wherein the purging comprises flowing a first inert gas into the deposition chamber;
flowing a second precursor into the deposition chamber, wherein the second precursor is configured to react with dangling bonds of the TMA precursor; and
purging at least a portion of the second precursor, wherein the purging comprises flowing a second inert gas into the deposition chamber;
performing a second plasma treatment on the etch stop layer; and
depositing a second dielectric layer on the etch stop layer.

17. The method of claim 16, wherein flowing the second precursor comprises flowing tert-butanol ((CH$_3$)$_3$COH), H$_2$O, ethylene glycol, and tert-amyl alcohol (TAA) into the deposition chamber.

18. The method of claim 16, wherein performing the first plasma treatment comprises performing the first plasma treatment at a temperature between about 150° C. and about 400° C.

19. The method of claim 16, wherein forming the etch stop layer further comprises flowing ammonia (NH$_3$) into the deposition chamber prior to flowing the TMA precursor.

20. The method of claim 16, wherein performing the second plasma treatment comprises performing an oxygen-based plasma process.

* * * * *